(12) United States Patent
Lin et al.

(10) Patent No.: US 12,396,265 B2
(45) Date of Patent: Aug. 19, 2025

(54) SEMICONDUCTOR STRUCTURE AND MANUFACTURING METHOD THEREOF

(71) Applicant: UNITED MICROELECTRONICS CORP., Hsin-Chu (TW)

(72) Inventors: Chun-Hsien Lin, Tainan (TW); Chien-Hung Chen, Taipei (TW); Ruei-Yau Chen, Pingtung County (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 457 days.

(21) Appl. No.: 17/875,430

(22) Filed: Jul. 28, 2022

(65) Prior Publication Data

US 2024/0006405 A1    Jan. 4, 2024

(30) Foreign Application Priority Data

Jun. 29, 2022    (TW) .................................. 111124203

(51) Int. Cl.
*H10D 89/10* (2025.01)
*H01L 21/762* (2006.01)
*H10D 84/01* (2025.01)
*H10D 84/03* (2025.01)
(Continued)

(52) U.S. Cl.
CPC ......... *H10D 89/10* (2025.01); *H10D 84/0151* (2025.01); *H10D 84/038* (2025.01); *H10D 84/907* (2025.01); *H10D 84/931* (2025.01)

(58) Field of Classification Search
CPC .. H10D 62/113; H10D 62/115; H10D 84/929; H10D 84/0151; H10D 62/116; H10D 84/931; H10D 62/126; H10D 64/519; H10D 89/10; H10D 84/907;
(Continued)

(56) References Cited

U.S. PATENT DOCUMENTS 9,570,454 B2 * 2/2017 Liu .................... H10D 30/6892
9,831,272 B2 * 11/2017 Chen .................... H10D 84/907
2014/0083972 A1    3/2014 Oyama
(Continued)

FOREIGN PATENT DOCUMENTS

CN    110875191    3/2020
TW    202017018    5/2020

OTHER PUBLICATIONS

Prior art: Ch. 7 MOSFET Technology Scaling, Leakage Current, and Other Topics (https://inst.eecs.berkeley.edu -> chp7full.pdf) ,2005.

*Primary Examiner* — Sonya McCall-Shepard
(74) *Attorney, Agent, or Firm* — Winston Hsu

(57) ABSTRACT

The invention provides a semiconductor structure, which comprises a first standard cell and a second standard cell located on a substrate, wherein an isolation region is included between the first standard cell and the second standard cell, a plurality of fin structures and a plurality of gates form a plurality of transistors, which are respectively located in the first standard cell and the second standard cell, and a plurality of single diffusion breaks (SDBs) located in the first standard cell and the second standard cell. A plurality of first dummy grooves in the first standard cell and the second standard cell, and a plurality of second dummy grooves in the isolation region, wherein some of the second dummy grooves overlap the first dummy grooves.

7 Claims, 4 Drawing Sheets

(51) Int. Cl.
*H10D 84/83* (2025.01)
*H10D 84/90* (2025.01)

(58) Field of Classification Search
CPC ........... H01L 21/76224; H01L 29/0642; H01L 29/0649; H01L 2027/11829
See application file for complete search history.

(56) References Cited

U.S. PATENT DOCUMENTS

| | | |
|---|---|---|
| 2016/0351411 A1 | 12/2016 | Xie |
| 2020/0349314 A1 | 11/2020 | Ryu |
| 2021/0319165 A1 | 10/2021 | Liebmann |

* cited by examiner

SEMICONDUCTOR STRUCTURE AND MANUFACTURING METHOD THEREOF

BACKGROUND OF THE INVENTION

1. Field of the Invention

The present invention relates to semiconductor integrated circuit layout, in particular to an integrated circuit layout composed of different standard cells with different sizes.

2. Description of the Prior Art

As the needs for better performance and various applications are increased, the integrated circuits (ICs) has become more and more complicated and usually includes hundreds of thousands or millions of logic gates. In the industry, to facilitate circuit design process, circuit units of specific functions commonly used in an integrated circuit are usually designed into standard cells with logic gates, such as NAND cells, NOR cells, d-flip-flop cells, latch cells, I/O cells, OP amplifier cells, ADC cells, DAC cells. After verifying the manufacturability for mass production of the standard cells, standard cell libraries including the verified standard cells may be authorized to the chip designers to construct functional circuitries by utilizing automated computer-aided design (CAD) tools such as logic simulator, logic synthesizer, and automatic placer & router. In this way, a complex and large integrated circuit may be correctly constructed within a short period of time.

A standard cell library of a specific function usually includes standard cells designed for different powers which may be mix used by the chip designer in a flexible way to obtain a desire performance. A common approach taken currently is to put the standard cells with different cell heights into different routing blocks and electrically connect the standard cells by metal interconnections. However, this has adversely limited the design flexibility. The extended length of the metal interconnections may also increase the power loss. On the other hand, when the standard cells have different cell heights, mix using the standard cells may easily produce irregular patterns and useless blank areas in the layout. This not only causes a waste of space, but also reduces the efficiency of the automated layout process due to the lower pattern regularity.

SUMMARY OF THE INVENTION

The invention provides a semiconductor structure comprising: a first standard cell and a second standard cell located on a substrate, wherein an isolation region is included between the first standard cell and the second standard cell, a plurality of fin structures and gates form a plurality of transistors, which are respectively located in the first standard cell and the second standard cell, a plurality of single diffusion breaks (SDBs) located in the first standard cell and the second standard cell, a plurality of first dummy grooves located in the isolation region, and a plurality of second dummy grooves located in the isolation region, wherein some of the second dummy grooves overlap the first dummy grooves.

The invention also provides a method of manufacturing a semiconductor structure, comprising: forming a plurality of fin structures on a substrate, performing a first fin-cut step to define a range of a first standard cell and a range of a second standard cell, and defining an isolation region between the first standard cell and the second standard cell, performing a second fin-cut step to remove part of the fin structures in the first standard cell and the second standard cell, and forming a plurality of first dummy grooves in the isolation region, forming a plurality of single diffusion breaks (SDBs) in the first standard cell and the second standard cell, and a plurality of second dummy grooves are formed in the isolation region, wherein some of the second dummy grooves overlap the first dummy grooves.

The invention is characterized in that standard cells with different sizes (for example, high-performance standard cells and low-energy standard cells, respectively) are mixed and formed in the same block, and then a plurality of first dummy grooves are formed in an isolation region generated between different standard cells. In addition, when the single diffusion breaks (SDB) are formed, a second dummy grooves with smaller sizes are also formed, the first dummy groove and the second dummy groove are formed in the isolation region, which is beneficial to improving the accuracy of the fin-cut step and the single diffusion break formation step, and effectively utilizing the space of the isolation region caused by the splicing of standard cells with different cell heights.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
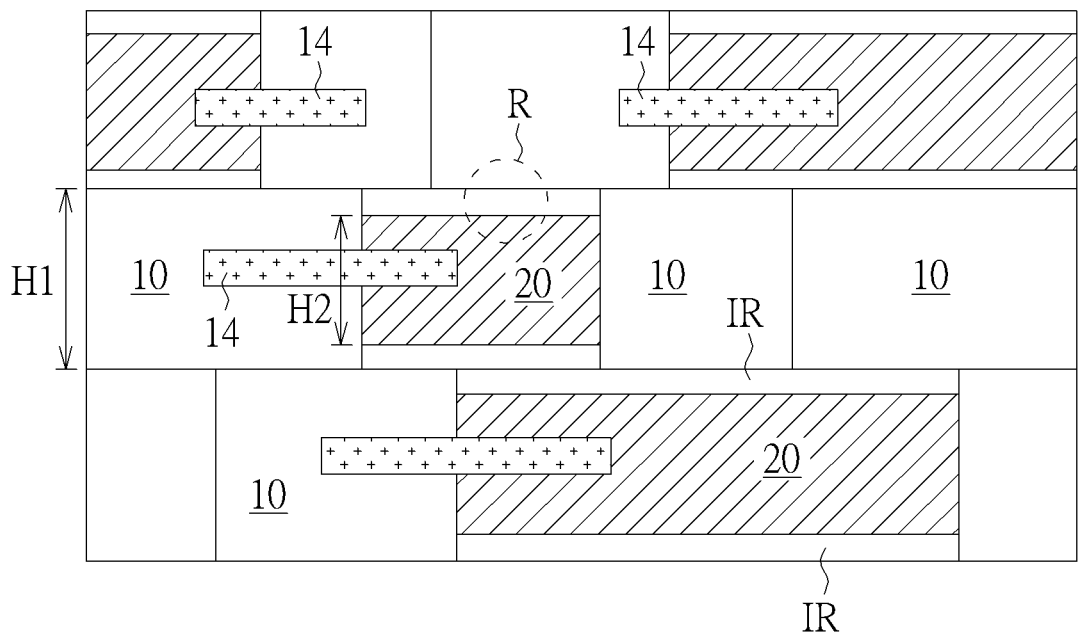
FIG. 1 is a schematic plan view of an integrated circuit layout according to an embodiment of the present invention.

As shown in FIG. 1, FIG. 1 is a schematic plan view of an integrated circuit layout according to an embodiment of the present invention. The layout of the integrated circuit includes at least two standard cells of different sizes, such as the first standard cell 10 and the second standard cell 20. In this embodiment, the sizes of the first standard cell 10 and the second standard cell 20 are different. For example, the first standard cell 10 can be a high-performance standard cell with a large cell height H1 and a large number of components, so its efficiency is relatively high. The second standard cell is a low-energy standard cell with a smaller cell height H2 and a small number of components, so its power consumption is low. In addition to the difference in size, the number of devices (such as the number of transistors, the number of fin structures) or the other parameters (such as the thickness of the gate dielectric layer) formed inside may be different. The present invention is not limited to the specific size and number of standard cells, and any integrated circuit layout that contains at least two standard cells of different sizes, or two standard cells that contain different numbers of fin structures, different numbers of transistors, etc. can fall within the scope of the present invention.

The first standard cell 10 and the second standard cell 20 are spliced in a same block, and then they can be connected with each other by the metal wire 14, thus reducing the length of the metal wire 14. However, due to the different sizes of the first standard cell 10 and the second standard cell 20, such as the different cell heights, when the first standard cell 10 and the second standard cell 20 are spliced, an isolation region is generated, such as the isolation region IR in FIG. 1. There is no element formed in the isolation region IR, so the isolation region IR will cause waste of area.

One of the purposes of the present invention is to effectively utilize the above-mentioned isolation region IR, specifically to form dummy grooves in the isolation region IR. As mentioned above, the isolation region IR belongs to an area where no elements are formed, so the density of elements in the adjacent standard cells is quite different. In order to prevent the elements in the standard cells from being affected by the density change, it is necessary to form dummy grooves. By forming dummy grooves in the isolation region IR, the precision of element formation can be improved, and the isolation region IR can be effectively utilized to reduce the waste of space.

Figure 2:
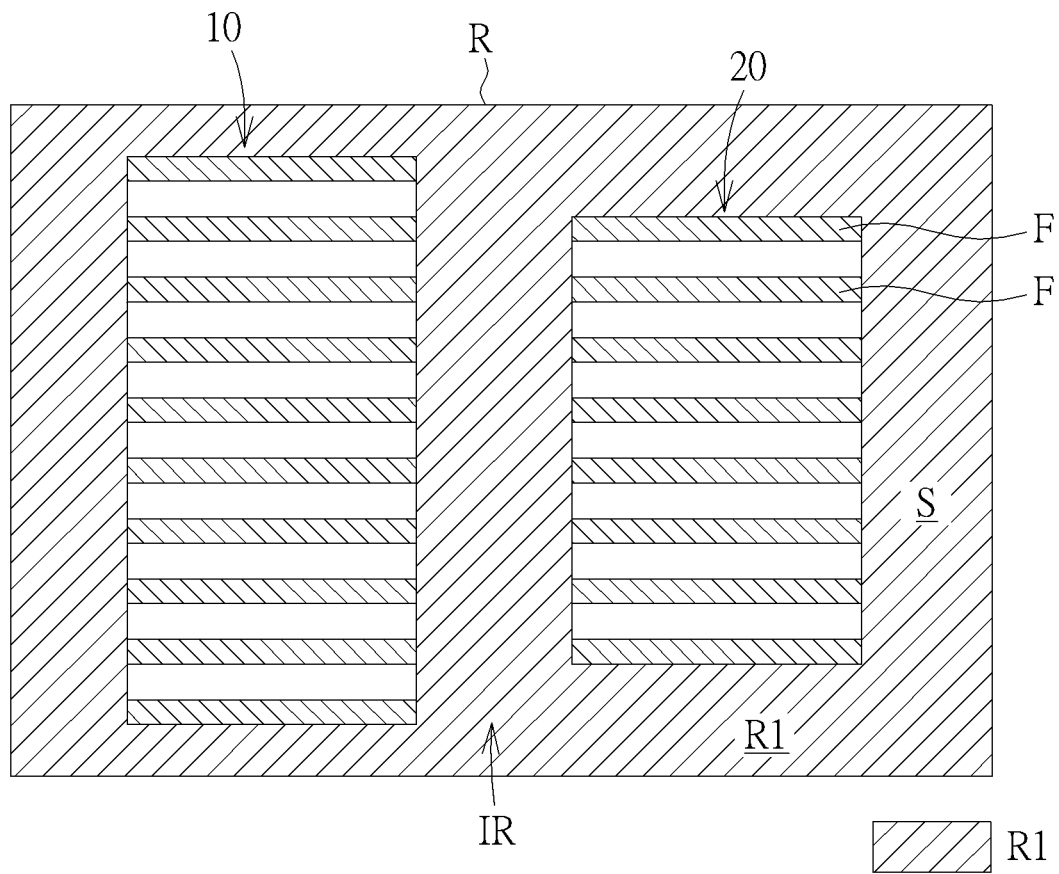
FIG. 2 is a schematic top view of a first standard cell and a second standard cell after a first fin-cut cutting step.

FIG. 2 is a schematic top view of a standard cell and a second standard cell after a first fin-cut step is performed. The range in FIG. 2 can be rotated by 90 degrees corresponding to the observation area R marked in FIG. 1, for example. As shown in FIG. 2, a substrate S is first provided, and a plurality of fin structures F are formed on the substrate S. Next, a first fin-cut step is performed, in which the first fin-cut step is, for example, an etching step, in which a part of the area which is not covered by a photoresist or a mask layer, and the other exposed part of the fin structures F are removed. The removal range is shown in FIG. 2, and the area removed by the first fin-cut step is defined as the removed area R1. After the first fin-cut step is performed, the position of the first standard cell 10 and the position of the second standard cell 20 are preliminarily defined, wherein the first standard cell 10 is adjacent to the second standard cell 20, and an isolation region IR is included between them. The fin structure was originally formed in the isolation region IR, but it was removed in the first fin-cut step, so the isolation region IR does not contain other elements. In addition, in this embodiment, the first fin-cut step includes a first exposure step, in which the critical dimension (CD) of the first exposure step is about 2400 nm to 3600 nm, but the present invention is not limited to this.

Figure 3:
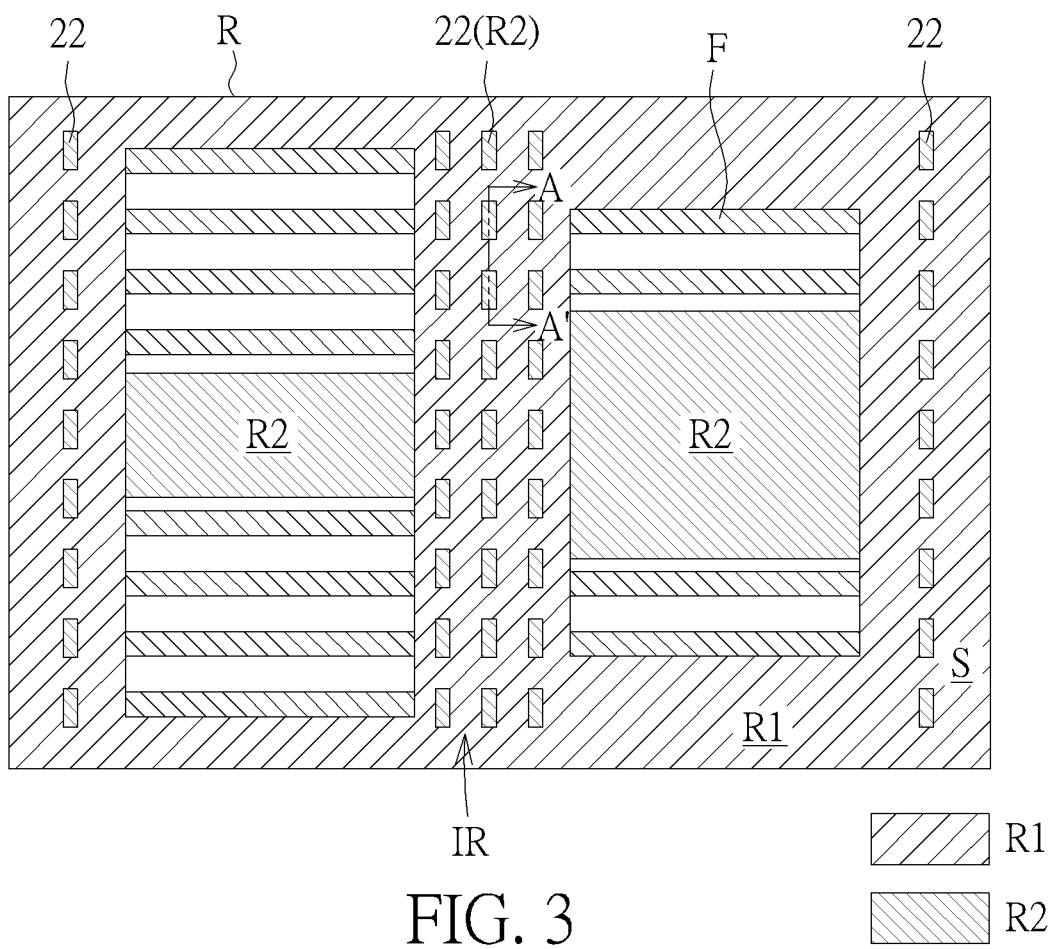
FIG. 3 is a schematic top view of the first standard cell and the second standard cell after a second fin-cut step.

FIG. 3 is a schematic top view of the first standard cell and the second standard cell after a second fin-cut step is performed. As shown in FIG. 3, a second fin cut step is performed, and a part of the fin structures are etched again in a manner similar to that described above. The removal range of the second fin-cut step is shown in the removed area R2 of FIG. 3. It is worth noting that the first fin-cut step shown in FIG. 2 is to define the position of each standard cell, so its cutting range and exposure critical dimension are large (about 2400 nm~3600 nm as mentioned above). However, the target removed in the second fin-cut step shown in FIG. 3 is parts of the fin structures F in each standard cell, and the corresponding cutting range is relatively small, and its exposure critical dimension is also small. In this embodiment, the second fin-cut step includes a second exposure step, and the exposure critical dimension (CD) of the second exposure step is about 240 nm to 360 nm, but the present invention is not limited to this.

As mentioned above, because the removed range of the second fin-cut step is finer, and the accuracy is improved, while the second fin-cut step is carried out, apart from removing part of the fin structures F in each standard cell, a plurality of first dummy grooves 22 are also formed in the isolation region IR. The purpose of forming the first dummy grooves 22 is to prevent the uneven exposure caused by the large density difference between the standard cell and the isolation region IR, thus affecting the accuracy of the second fin-cut step. That is, in the second fin-cut step, parts of the fin structures F are removed and the first dummy grooves 22 are formed at the same time, which helps to improve the accuracy of the second fin-cut step. It should be noted that the first dummy grooves 22 may also belong to a part of the removed area R2 of the second fin-cut step. In other words, when the second fin-cut step is performed, the removal of some fin structures F is performed simultaneously with the first dummy grooves 22 are formed.

Figure 4:
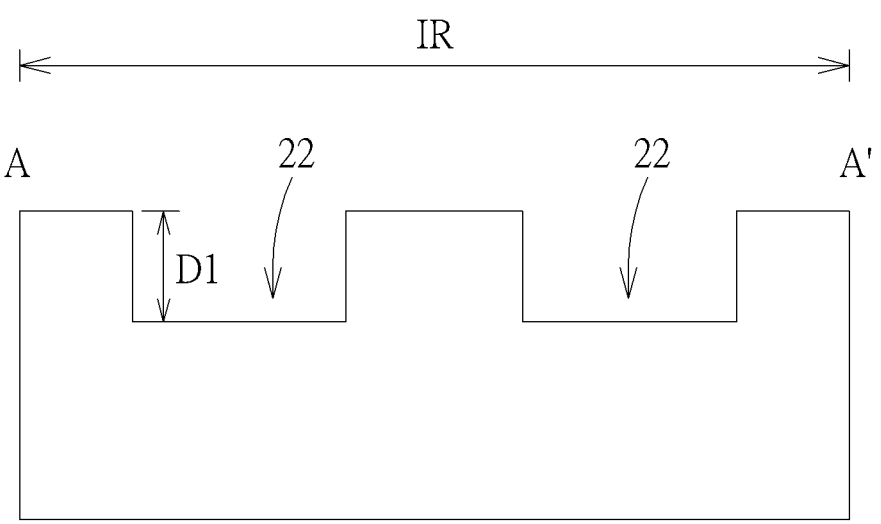
FIG. 4 shows a schematic cross-sectional structure taken along the cross-sectional line A-A' in FIG. 3.

FIG. 4 shows a schematic cross-sectional structure taken along the cross-sectional line A-A' in FIG. 3. Since a plurality of first dummy grooves 22 are formed at the same time when the second fin-cut step is carried out, a plurality of concave first dummy grooves 22 will be generated in the isolation region IR from a cross-sectional view. The depth of each first dummy groove 22 can be defined as D1.

Figure 5:
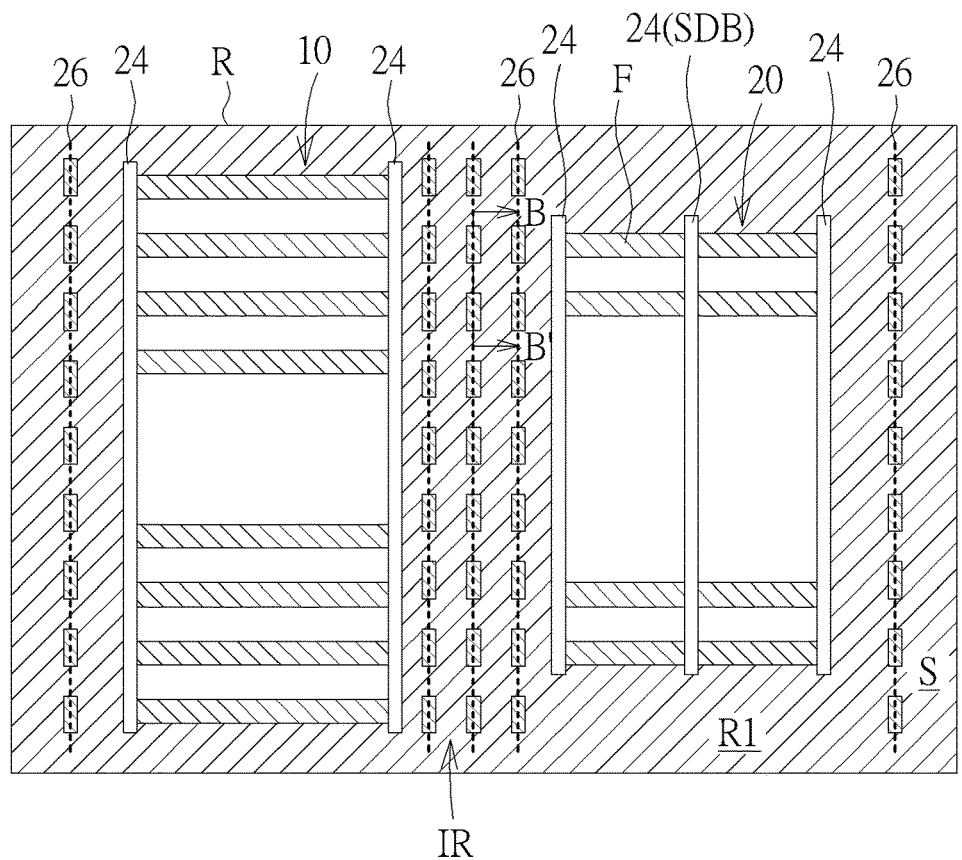
FIG. 5 is a top view of the first standard cell and the second standard cell after forming a single diffusion break (SDB).

FIG. 5 is a top view of the first standard cell and the second standard cell after forming single diffusion breaks. Next, as shown in FIG. 5, a plurality of single diffusion breaks (SDBs) are formed in the first standard cell 10 and the second standard cell 20 respectively. The structure of the single diffusion breaks is that a groove 24 is formed right below the dummy gate to be formed subsequently and an insulating layer is filled in, so that the dummy gate has a similar effect to shallow trench isolation (STI), but its size is smaller than that of ordinary shallow trench isolation, so it is beneficial to reduce the area of standard cells. In order to form the single diffusion breaks SDB, it is necessary to form a plurality of grooves 24 in the first standard cell 10 and the second standard cell 20 respectively. These grooves 24 are located directly below the dummy gates to be formed later and are arranged in parallel with other gates. It is worth noting that a part of the grooves 24 are located at the boundary between the standard cell (the first standard cell 10 or the second standard cell 20) and the isolation region IR. Therefore, when the single diffusion breaks SDB are formed (that is, when the grooves 24 are formed), it is necessary to form a plurality of second dummy grooves 26 in the isolation region IR at the same time, so as to avoid the uneven exposure caused by the large density difference between the standard cell and the isolation region IR, thus affecting the accuracy of the single diffusion breaks SDB. It should be noted that since the size of the single diffusion breaks SDB are much smaller than the removal area R2 of the above-mentioned second fin-cut step, so the areas of the corresponding second dummy grooves 26 are also smaller than the areas of the first dummy grooves 22. For example, in this embodiment, the step of forming the single diffusion breaks SDB (that is, when the grooves 24 are formed) includes a third exposure step, wherein the exposure critical dimension (CD) of the third exposure step is about 24 nm to 36 nm, but it is not limited to this. It is worth noting that the grooves 24 in the first standard cell 10 and the second standard cell 20 are formed at the same time as the second dummy grooves 26 in the isolation region IR.

Figure 6:
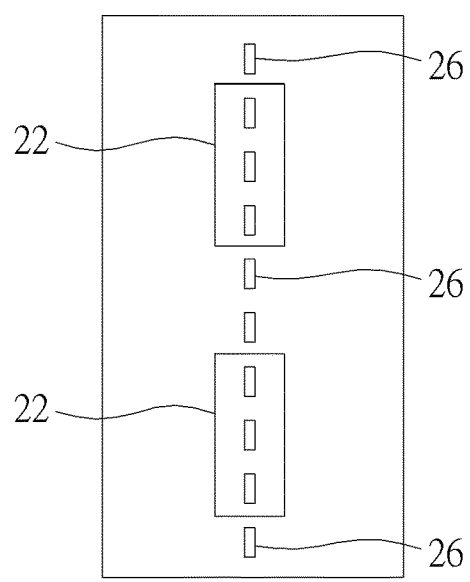
FIG. 6 is a partially enlarged schematic diagram showing an isolation region IR.
Figure 7:
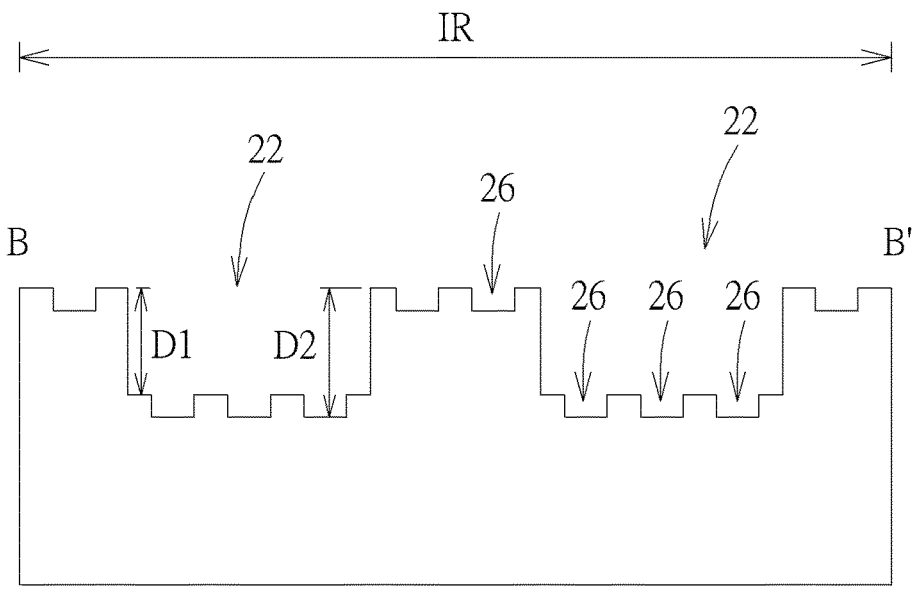
FIG. 7 is a sectional view taken along the cross-sectional line B-B' in FIG. 6.

As shown in FIG. 6 and FIG. 7, FIG. 6 shows a partially enlarged schematic diagram of the isolation region IR, and FIG. 7 shows a cross-sectional view taken along the cross-sectional line B-B' in FIG. 6. As mentioned above, both the first dummy grooves 22 and the second dummy grooves 26 are located in the isolation region IR, and the size of the second dummy grooves 26 are smaller than that of the first dummy grooves 22. For example, in this embodiment, if the area of each first dummy groove 22 is defined as A and the area of each second dummy groove 26 is defined as B, this embodiment preferably satisfies the condition that A/B>50, but the present invention is not limited to this. In this embodiment, since each first dummy groove 22 overlaps a plurality of second dummy grooves 26, the first dummy groove 22 has a first depth D1 in cross section, and some of the second dummy grooves 26 are formed at the bottom of the first dummy groove 22, that is, the overlapping part of the first dummy groove 22 and the second dummy groove 26 has a second depth D2, where the depth D2 is greater than the depth D1. In other words, the overlapping part of the first dummy groove 22 and the second dummy groove 26 has a deeper depth.

Figure 8:
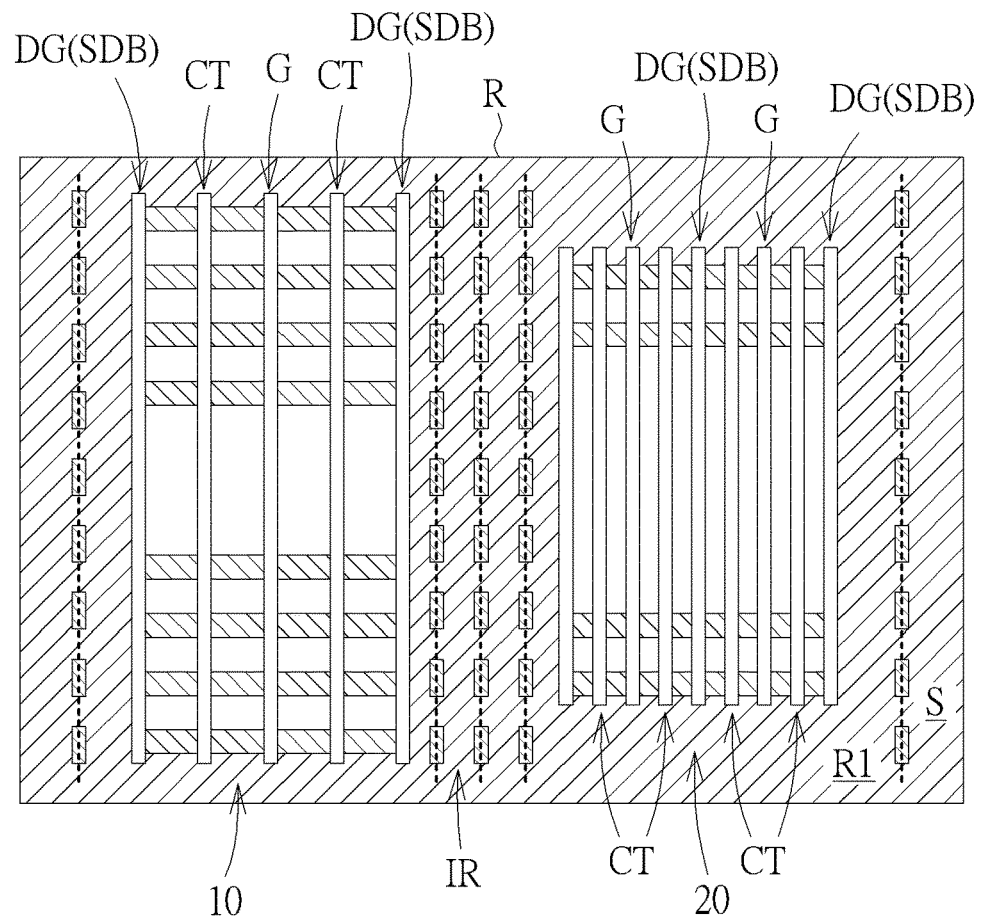
FIG. 8 is a schematic top view of the first standard cell and the second standard cell after forming the gates, the dummy gates and the contact structures.

FIG. 8 is a schematic top view of the first standard cell and the second standard cell after forming the gates, the dummy gates and the contact structures. As shown in FIG. 8, insulating material (such as silicon oxide) is filled in the groove 24 to form a plurality of single diffusion breaks (SDBs), and a plurality of gates G and a plurality dummy gates DG are formed in the first standard cell 10 and the second standard cell 20 respectively. The number and size of the gates G vary according to the types of the first standard cell 10 and the second standard cell 20 (e.g., the high-performance standard cell or the low-energy standard cell). For example, in the first standard cell 10, the gates G span more fin structures to achieve better performance. In addition, the dummy gates DG are formed and covered right above the single diffusion breaks SDBs (the grooves 24). Each dummy gate DG has the function of blocking element (similar to shallow trench isolation). The gates G and dummy gates DG both span a plurality of fin structures F to form a plurality of transistors, and the dummy gates DG are arranged in parallel with the gates G. In addition, an source/drain region or a plurality of contact structures are formed beside the gates G or the dummy gates DG. In this embodiment, the strip-shaped contact structures CT are taken as an example, but the present invention is not limited to this. The method of forming the gates, the dummy gates and the contact structures mentioned above belongs to the conventional technology in the field, and will not be repeated here.

According to the above description and drawings, the present invention provides a semiconductor structure, which comprises a first standard cell 10 and a second standard cell 20 on a substrate S, wherein an isolation region IR is included between the first standard cell 10 and the second standard cell 20, and a plurality of fin structures F and gates G form a plurality of transistors, which are respectively located in the first standard cell 10 and the second standard cell 20. A plurality of single diffusion breaks (SDBs) are located in the first standard cell 10 and the second standard cell 20, a plurality of first dummy grooves 22 are located in the isolation region IR, and a plurality of second dummy grooves 26 are located in the isolation region IR, wherein some of the second dummy grooves 26 overlap with the first dummy grooves 22.

In some embodiments of the present invention, in the isolation region IR, the first dummy groove 22 has a first depth D1, and an overlapping part of the first dummy groove 22 and the second dummy groove 26 has a second depth, wherein the second depth is greater than the first depth.

In some embodiments of the present invention, an area of the first dummy groove is defined as A, and an area of the second dummy groove is defined as B, where A/B>50.

In some embodiments of the present invention, the first standard cell 10 is a high-performance standard cell, and the second standard cell 20 is a low-energy standard cell.

In some embodiments of the present invention, an area A of the first standard cell 10 is larger than an area of the second standard cell.

In some embodiments of the present invention, the number of fin structures F in the first standard cell 10 is greater than that in the second standard cell 20.

In some embodiments of the present invention, some of the gate G includes dummy gates DG, and some of the dummy gate DG overlaps with the single diffusion break SDB, and the dummy gate DG and the single diffusion break SDB are arranged in the same direction.

In some embodiments of the present invention, the fin structure F, the gates G and the single diffusion breaks SDB are not included in the isolation region IR.

The present invention also provides a manufacturing method of semiconductor structure, which includes forming a plurality of fin structures F on a substrate S, performing a first fin-cut step to define a range of a first standard cell 10 and a range of a second standard cell 20, defining an isolation region IR between the first standard cell 10 and the second standard cell 20, and performing a second fin-cut step. Parts of the fin structures F in the first standard cell 10 and the second standard cell 20 are removed, and a plurality of first dummy grooves 22 are formed in the isolation region IR, a plurality of single diffusion breaks SDBs are formed in the first standard cell 10 and the second standard cell 20, and a plurality of second dummy grooves 26 are formed in the isolation region IR, wherein some of the second dummy grooves 26 overlap the first dummy grooves 22.

In some embodiments of the present invention, in the isolation region IR, the first dummy groove 22 has a first depth D1, and the overlapping part of the first dummy groove 22 and the second dummy groove 26 has a second depth D2, wherein the second depth D2 is greater than the first depth.

In some embodiments of the present invention, an area of the first dummy groove 22 is defined as A, and an area of the second dummy groove 26 is defined as B, where A/B>50.

In some embodiments of the present invention, the first standard cell 10 is a high-performance standard cell, and the second standard cell 20 is a low-energy standard cell.

In some embodiments of the present invention, an area of the first standard cell 10 is larger than an area of the second standard cell 20.

In some embodiments of the present invention, the number of fin structures F in the first standard cell 10 is greater than that in the second standard cell 20.

In some embodiments of the present invention, a plurality of gates G are formed in the range of the first standard cell 10 and the second standard cell 20.

In some embodiments of the present invention, some of the gate G includes dummy gates DG, and the dummy gate DG overlaps with the single diffusion break SDB and is arranged in the same direction.

In some embodiments of the present invention, each single diffusion break SDB is formed simultaneously with each second dummy groove 26.

In some embodiments of the present invention, the first fin-cut step includes a first exposure step, and an exposure critical dimension (CD) of the first exposure step is about 2400 nm to 3600 nm.

In some embodiments of the present invention, the second fin-cut step includes a second exposure step, and an exposure critical dimension (CD) of the second exposure step is about 240 nm to 360 nm.

In some embodiments of the present invention, the method for forming the single diffusion breaks SDB includes a third exposure step, and an exposure critical dimension (CD) of the third exposure step is about 24 nm to 36 nm.

The invention is characterized in that standard cells with different sizes (for example, high-performance standard cells and low-energy standard cells, respectively) are mixed and formed in the same block, and then a plurality of first dummy grooves are formed in an isolation region generated between different standard cells. In addition, when the single diffusion breaks (SDB) are formed, a second dummy grooves with smaller sizes are also formed, the first dummy groove and the second dummy groove are formed in the isolation region, which is beneficial to improving the accuracy of the fin-cut step and the single diffusion break formation step, and effectively utilizing the space of the isolation region caused by the splicing of standard cells with different cell heights.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure comprising:
   a first standard cell and a second standard cell located on a substrate, wherein an isolation region is included between the first standard cell and the second standard cell;
   a plurality of fin structures and gates forming a plurality of transistors, which are respectively located in the first standard cell and the second standard cell;
   a plurality of single diffusion breaks (SDBs) located in the first standard cell and the second standard cell;
   a plurality of first dummy grooves located in the isolation region; and
   a plurality of second dummy grooves located in the isolation region, wherein some of the second dummy grooves of the plurality of second dummy grooves overlap the plurality of the first dummy grooves to define an overlapping part, wherein in the isolation region, at least one first dummy groove of the plurality of the first dummy grooves has a first depth, and the overlapping part of the at least one first dummy groove of the plurality of the first dummy grooves and at least one second dummy groove of the plurality of the second dummy grooves has a second depth, wherein the second depth is greater than the first depth.

2. The semiconductor structure according to claim 1, wherein an area of the at least one first dummy groove of the plurality of the first dummy grooves is defined as A, and an area of the at least one second dummy groove of the plurality of the second dummy grooves is defined as B, where A/B>50.

3. The semiconductor structure according to claim 1, wherein the first standard cell is a high-performance standard cell and the second standard cell is a low-energy standard cell.

4. The semiconductor structure according to claim 3, wherein an area of the first standard cell is larger than an area of the second standard cell.

5. The semiconductor structure according to claim 3, wherein the number of fin structures in the first standard cell is greater than the number of fin structures in the second standard cell.

6. The semiconductor structure according to claim 1, wherein the gates include a part of dummy gates, wherein the dummy gates overlaps with the single diffusion breaks, and wherein the dummy gates and the single diffusion breaks are arranged in the same direction.

7. The semiconductor structure according to claim 1, wherein the fin structure, the gate and the single diffusion break are not included in the isolation region.

* * * * *